United States Patent
Booth

(10) Patent No.: US 11,303,289 B2
(45) Date of Patent: *Apr. 12, 2022

(54) FREQUENCY-MULTIPLYING DIRECT DIGITAL SYNTHESIZER

(71) Applicant: Eridan Communications, Inc., Mountain View, CA (US)

(72) Inventor: Richard W. D. Booth, Carson City, NV (US)

(73) Assignee: Eridan Communications, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/002,967

(22) Filed: Aug. 26, 2020

(65) Prior Publication Data

US 2021/0226642 A1 Jul. 22, 2021

Related U.S. Application Data

(63) Continuation of application No. 16/746,690, filed on Jan. 17, 2020, now Pat. No. 10,763,873.

(51) Int. Cl.
*H03L 7/24* (2006.01)
*G06F 1/02* (2006.01)
(Continued)

(52) U.S. Cl.
CPC .......... *H03L 7/24* (2013.01); *G06F 1/022* (2013.01); *G06F 1/0328* (2013.01); *H03M 9/00* (2013.01)

(58) Field of Classification Search
None
See application file for complete search history.

(56) References Cited

U.S. PATENT DOCUMENTS 10,763,873 B1 * 9/2020 Booth .................. H03M 9/00

OTHER PUBLICATIONS

Int'l Search Report (ISR) and Written Opinion from PCT/US20/47915.

* cited by examiner

*Primary Examiner* — Cassandra F Cox
(74) *Attorney, Agent, or Firm* — Patent Law Professionals, P.C.; William E. Winters

(57) ABSTRACT

A frequency-multiplying DDS includes a digital multiplier, a phase accumulator, a post-accumulator digital processing section, and a digital-to-analog converter (DAC). The digital multiplier multiplies a digital tuning word of value M by a digital multiplier of value B, to produce a digital product (M×B), and the n-bit accumulator accumulates by a step size of the digital product (M×B), at a rate of a low-speed reference clock of frequency $f_{CLK}/B$. The post-accumulator digital processing section synthesizes B digital waveforms from the sequence of n-bit accumulator output numbers produced by the n-bit accumulator, and rotates each digital waveform with respect to each adjacent digital waveform by $(M/2^n) \times 2\pi$ radians. The DAC serializes the digital samples of the B digital waveforms at full speed, i.e., at a rate $f_{CLK}$, to produce a full-speed serialized digital output having $2^n/M$ samples per cycle, and converts the full-speed serialized digital output to a final output analog waveform of frequency $f_{OUT}=(M/2^n) \times f_{CLK}$.

14 Claims, 7 Drawing Sheets

(51) Int. Cl.
*H03M 9/00* (2006.01)
*G06F 1/03* (2006.01)

FREQUENCY-MULTIPLYING DIRECT DIGITAL SYNTHESIZER

CROSS-REFERENCE TO RELATED APPLICATIONS

This application is a continuation of U.S. patent application Ser. No. 16/746,690, filed Jan. 17, 2020.

BACKGROUND OF THE INVENTION

Direct digital synthesis (DDS) is a digital signal processing technique that creates (i.e. "synthesizes") sinusoids and other types of waveforms from a single precision fixed-frequency reference clock. FIG. 1 is a drawing showing the principal elements of a typical DDS 100. The DDS 100 comprises a phase accumulator 102; a phase-to-amplitude ($\varphi$-to-$\rho$ converter 104; a digital-to-analog converter (DAC) 106; and a low-pass filter (LPF) 108. The phase accumulator 102 is a synchronous sequential device which on each cycle of a reference clock (denoted by "$f_{REF}$" in FIG. 1) produces an n-bit digital number representing the instantaneous phase $\varphi$ of the final DDS output waveform being synthesized. On each cycle of the reference clock, the output of the accumulator 102 is fed back to an n-bit adder 110 and summed with an n-bit "tuning word" M. This results in the accumulator 102 incrementing (i.e., "accumulating") by a "step" equal to the value of the tuning word M, on each cycle of the reference clock. The accumulator 102 keeps accumulating in this manner until the n-bit digital number it is accumulating exceeds the capacity ($2^n-1$) of its n-bit output register 112, in other words, until the output register 112 "overflows." When this overflow condition occurs, the overflow bit is discarded, leaving only the remainder (i.e., the "residual") in the output register 112, and the accumulator 102 repeats the accumulation process once again.

To further visualize the operation of the accumulator 102, it can be helpful to use a diagram known as a "phase wheel" (see FIG. 2). Assuming, for example, that the accumulator 102 of the DDS 100 depicted in FIG. 1 has a word width of n=4, a tuning word of M=0011, and an initial phase accumulator output of 0000, the phasor in the phase wheel representing the accumulator 102 output rotates counter-clockwise around the wheel, step-by-step, (by a "step size" of M=0011), and on each tick of the reference clock, until the accumulated result exceeds 1111 and the accumulator's output register overflows. Each traversal of the phase wheel represents one cycle $1/f_{OUT}$ of the accumulator's final output OUT. The rate at which the phasor rotates about the phase wheel is determined by reference clock frequency $f_{REF}$, and the number of steps (samples) made in each cycle of $f_{OUT}$ is determined by the value of the tuning word M relative to $2^n$. For a given reference clock frequency $f_{REF}$, the output frequency $f_{OUT}$ can be increased by increasing the value of M, but at the expense of a reduced number of samples per cycle $1/f_{OUT}$.

The phase wheel in FIG. 2 further reveals how each step of the rotating phasor represents the instantaneous phase $\varphi$ of the waveform being synthesized. For example, the first n-bit digital number value 0011 produced by the accumulator 102 after the accumulator has been initialized to 0000 represents an instantaneous phase of $\varphi=3\pi/8$ radians (67.5 degrees), the second accumulated n-bit digital number of value 0110 represents an instantaneous phase of $\varphi=3\pi/4$ radians (135 degrees), and so on.

The phase-to-amplitude ($\varphi$-to-$\varphi$ converter 104, which is typically implemented as a sine look-up table (LUT) in a read-only memory (ROM), converts the sequence of n-bit digital numbers produced by the accumulator 102 into a digital waveform (most often a sinusoid, but other waveforms are also possible). (Note that in circumstances where the accumulator size (i.e., "accumulator width" n) is large, the n-bit digital samples produced by accumulator 102 are usually truncated so that only the p most significant bits (MSBs) are used to address the LUT. In this way, the LUT is maintained at a manageable size.) The sequence of n-bit digital samples produced at the output of the $\varphi$-to-$\rho$ converter 104 is therefore a digital sinusoid of frequency $f_{OUT}=(M/2^n) \times f_{REF}$. The DAC 106 converts the digital sinusoid into a quantized analog waveform (e.g., a quantized analog voltage), and the LPF 108 operates to remove aliasing images and quantization noise, to produce the final, desired and smooth sinusoidal output OUT.

The DDS 100 has a number of important advantages over more conventional phase-locked loop based (PLL-based) waveform generators. Some of these advantages include: a much wider tuning bandwidth; superior frequency agility, and micro-hertz frequency-tuning and sub-degree phase-tuning capabilities. These attributes make the DDS 100 a desirable candidate for use in radar and radio frequency (RF) communications applications. One limitation of the DDS 100, however, is that there is a limit on how high the output frequency $f_{OUT}$ can be made. For a given word width n, the output frequency $f_{OUT}$ can be increased by increasing the value of the tuning word M and/or by increasing the reference clock frequency $f_{REF}$. However, these two parameters cannot be increased without limit. The Nyquist-Shannon sampling theorem dictates that $M<2^{n-1}$, and the maximum possible reference clock frequency that can be applied to the DDS 100 is limited by the processing delay of its accumulator 102. These limitations on the DDS's 100's maximum possible output frequency $f_{OUT}$ therefore pose a problem, particularly if it is desired to employ the DDS 100 in radar or microwave communication applications operating at very high frequencies, for example, 10 GHz and higher.

BRIEF SUMMARY OF THE INVENTION

A frequency-multiplying direct digital synthesizer (DDS) and method of its operation are disclosed. An exemplary frequency-multiplying DDS includes a digital multiplier, a phase accumulator, a post-accumulator digital processing section, and a digital-to-analog converter (DAC). The digital multiplier multiplies a digital tuning word of value M by a digital multiplier of value B, to produce a digital product (M×B), and the n-bit accumulator accumulates by a step size of the digital product (M×B), at a rate of a low-speed reference clock of frequency $f_{CLK}/B$. The post-accumulator digital processing section synthesizes B digital waveforms from the sequence of n-bit accumulator output numbers produced by the n-bit accumulator, and rotates each digital waveform with respect to each adjacent digital waveform by $(M/2^n) \times 2\pi c$ radians. Finally, the DAC serializes the digital samples of the B digital waveforms at full speed, in other words at a rate $f_{CLK}$, to produce a full-speed serialized digital output having 2n/M samples per cycle, and converts the full-speed serialized digital output to a final output analog waveform of frequency $f_{OUT}=(M/2^n) \times f_{CLK}$.

The frequency-multiplying DDS can produce an output OUT having the same output frequency $f_{OUT}$ as that produced by a conventional DDS, and with the same frequency tuning resolution, yet the accumulator only needs to be clocked at 1/B the reference clock frequency. Viewed conversely, for the same accumulator width n, same tuning word M, and same accumulator reference clock frequency, the frequency-multiplying DDS is capable of synthesizing an output waveform having a frequency B times the output frequency of the conventional DDS. Tests and simulations have shown that the frequency-multiplying DDS is capable of producing output frequencies greater than 10 GHz, thus making it well-suited for high-frequency radar and microwave communications applications.

Further features and advantages of the invention, including a detailed description of the above-summarized and other exemplary embodiments of the invention, will now be described in detail with respect to the accompanying drawings, in which like reference numbers are used to indicate identical or functionally similar elements.

DETAILED DESCRIPTION

Figure 1:
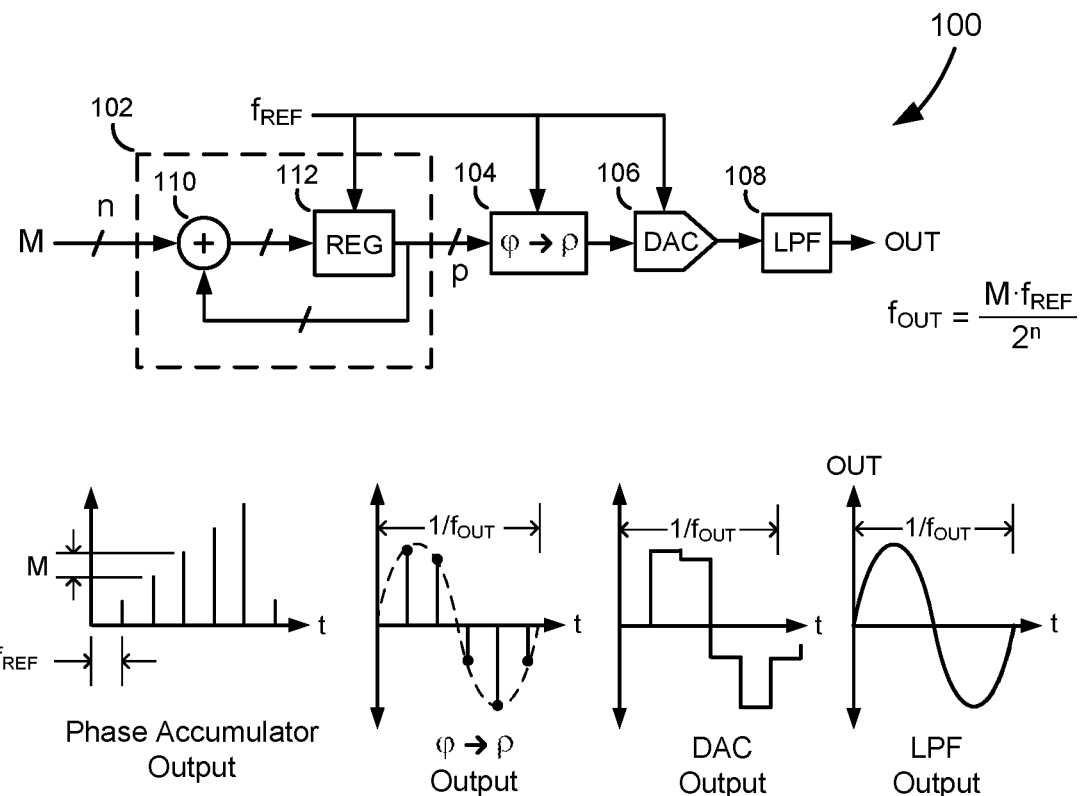
FIG. 1 is a drawing depicting the principal elements of a conventional direct digital synthesizer (DDS)
Figure 2:
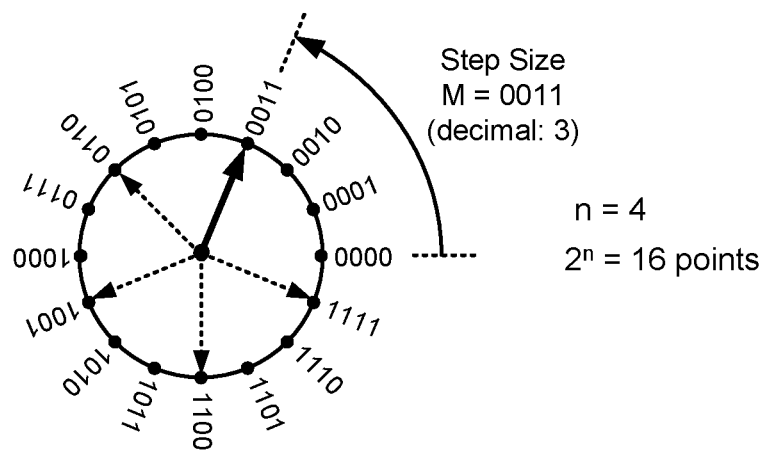
FIG. 2 is a drawing of a phase wheel, illustrating how the accumulator in the conventional DDS depicted in FIG. 1 operates.
Figure 3:
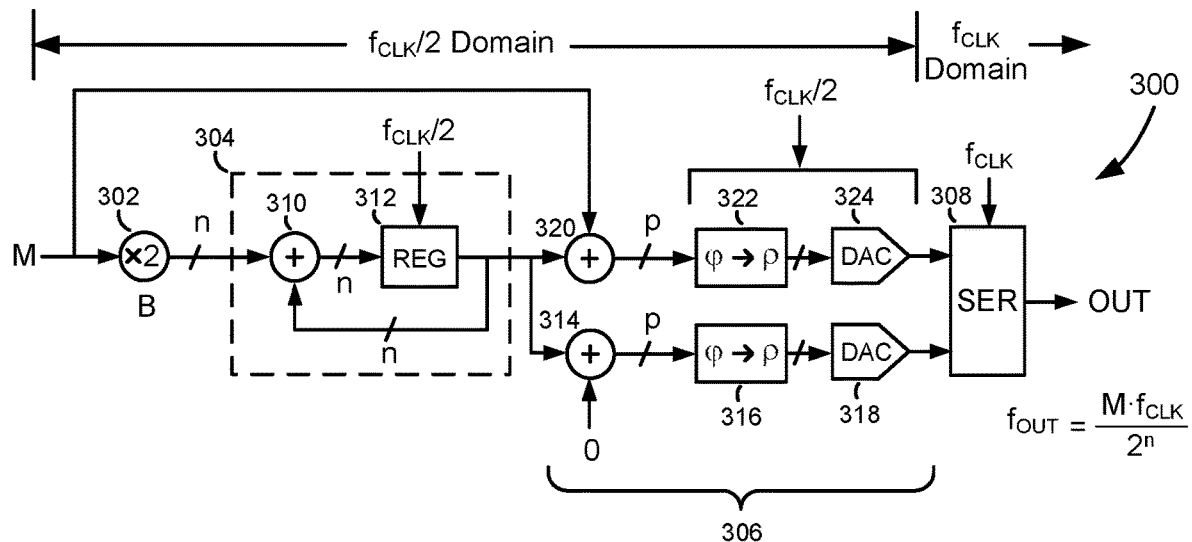
FIG. 3 is a drawing depicting a frequency-doubling DDS, according to one embodiment of the present invention.

Referring to FIG. 3, there is shown a direct digital synthesizer (DDS) 300, according to one embodiment of the present invention. The DDS 300 comprises a digital multiplier 302; a phase accumulator 304 (or "accumulator" for short); a post-accumulator digital processing section 306; and a serializer 308. The digital multiplier 302 multiplies a digital tuning word M, which serves as the multiplicand, by a digital multiplier B=2 (decimal). The resulting product (M×B) is applied to a first input of an n-bit adder 310 in the accumulator 304, and the accumulator 304 is configured so that it accumulates at a rate of fixed precision reference clock of frequency $f_{CLK}/B = f_{CLK}/2$. The accumulator 304 thus accumulates by a step size of (M×B), at a rate of $f_{CLK}/B = f_{CLK}/2$.

Figure 4:
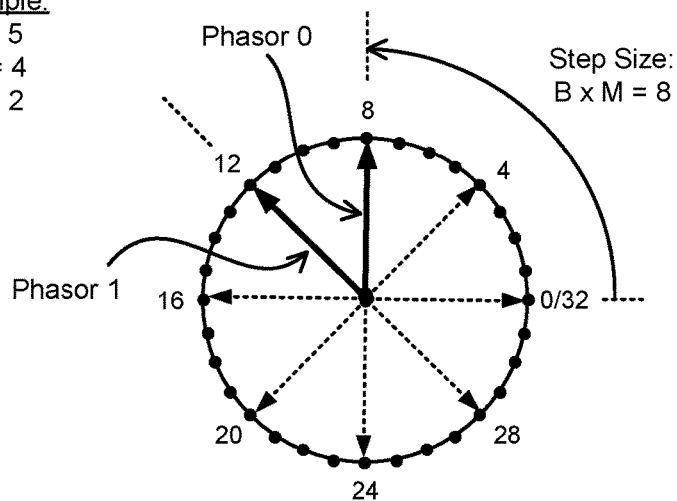
FIG. 4 is a drawing of a phase wheel, illustrating the operation of the accumulator and a portion of the post-accumulator digital processing section of the frequency-doubling DDS depicted in FIG. 3.

The post-accumulator digital processing section 306, which is also clocked at $f_{CLK}/B = f_{CLK}/2$, includes two branches within which two waveforms (e.g., sinusoids) are synthesized. The first branch includes an n-bit zero-offset adder 314; a first phase-to-amplitude (φ-to-ρ) converter 316; and a first digital-to-analog converter (DAC) 318, and the second branch includes an n-bit step-offset adder 320; a second φ-to-ρ converter 322; and a second DAC 324. The output of the accumulator 304 is fed to both branches of the post-accumulator digital processing section 306, specifically, to the zero-offset adder 314 in the first branch and the step-offset adder 320 in the second branch. Accordingly, each n-bit output of the accumulator 304 serves as the augend to both the zero-offset adder 314 and the step-offset adder 320. Whereas the augends to the zero-offset adder 314 and the step-offset adder 320 are the same, the addends are not. In particular, the addend to the zero-offset adder 314 is zero and the addend to the step-offset adder 320 is the tuning word M. In terms of phase, the output of the step-offset adder 320 thus leads the output of the zero-offset adder 314 by $(M/2^n) \times 2\pi$ radians, or, in terms of time, by $\Delta t = (M/2^n)/f_{OUT}$ seconds. This can be more readily visualized by referring to the phase wheel in FIG. 4, where, for purpose of example: n=5, M=4 and B=2. "Phasor 0" in the phase wheel represents the instantaneous phase of a first waveform (i.e., "first phase") synthesized in the first branch, and "phasor 1," which leads phasor 0 by $(M/2^n) \times 2\pi$ radians, represents the instantaneous phase of a second waveform (i.e., "second phase") synthesized in the second branch. Note that due to the multiplier B=2, both phasors rotate around the phase wheel by steps of $(M \times B)/2^n \times 2\pi$ radians, on each tick of the half-speed clock ($f_{CLK}/2$). However, beneficially, and as will be discussed in more detail below, both phasors rotate at a rate of only $f_{CLK}/B = f_{CLK}/2$.

Figure 5:
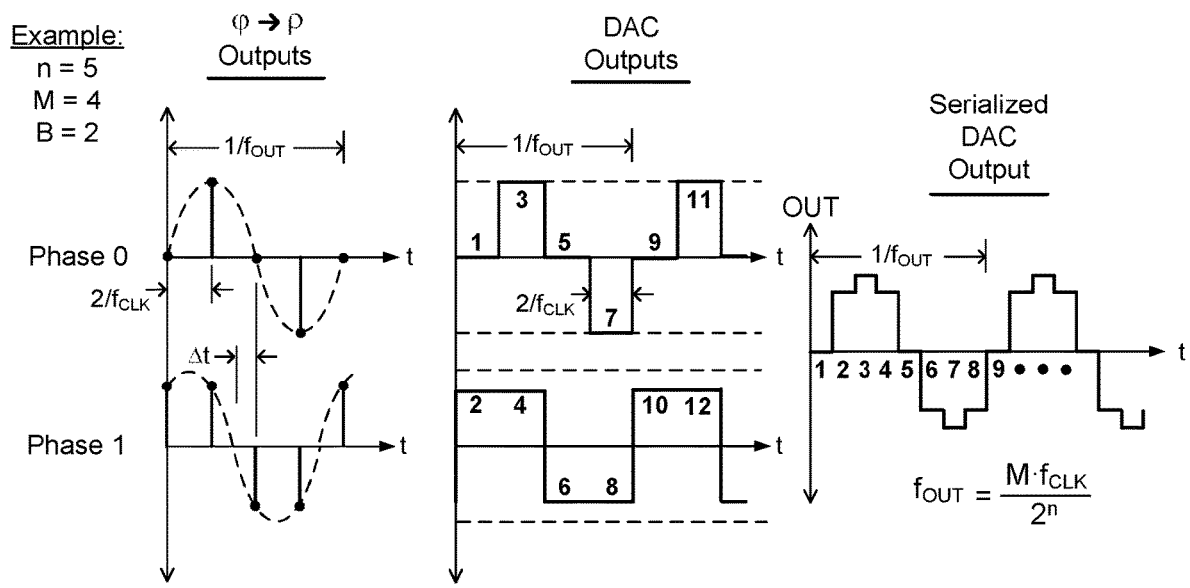
FIG. 5 includes timing diagrams of the outputs of the phase-to-amplitude (φ-to-φ converters and digital-to-analog converters (DACs) in the post-accumulator digital processing section of the frequency doubling DDS depicted in FIG. 3, and a timing diagram of the full-speed serialized DAC output produced at the output of the frequency-doubling DDS.

The two sequences of summed samples produced at the outputs of the zero-offset and step-offset adders 314 and 320 are directed to the inputs of the first and second φ-to-ρ converters 316 and 322. In one embodiment of the invention the first and second φ-to-ρ converters 316 and 322 comprise first and second look-up table (LUT) stored in a read-only memory (ROM), and the sequences of summed samples produced at the outputs of the step-offset and zero-offset adders 314 and 320 are used to address the LUTs to determine the appropriate magnitude ρ (e.g., voltage or current magnitude) to be assigned for each input sample. The left-most timing diagrams in FIG. 5 show the first and second digital sinusoids produced at the outputs of the φ-to-ρ converters 316 and 322. As can be seen, for this example of n=5, M=4, B=2, the first and second digital sinusoids each has $2n/(M \times B) = 32/8 = 4$ samples per cycle, and a frequency of: $[(M \times B)/2^n] \times (f_{CLK}/B) = (M/2^n) \times f_{CLK}$.

It should be mentioned that although the φ-to-ρ converters in the exemplary embodiments disclosed herein are described and illustrated as being configured to produce sinusoidal waveforms, they and the DDSs can be alternatively configured to produce other types of waveforms (e.g., square, triangular etc.), as will be appreciated by those of ordinary skill in the art. It should also be mentioned that although multiple φ-to-ρ converters (two in the exemplary DDS 300 depicted in FIG. 3) are used to complete the φ-to-ρ conversion, a single, shared LUT could be used, instead. Still further, it should be mentioned that, although a ROM-based φ-to-ρ conversion is used in this exemplary embodiment of the DDS 300, a ROM-less φ-to-ρ conversion process, for example, one that computes or approximates the first and second waveforms on-the-fly, could be employed, instead.

The middle timing diagram in FIG. 5 shows the quantized analog sinusoidal waveforms after having been converted by the first and second DACs 318 and 324. In one embodiment of the invention the serializer 308 comprises a switch or multiplexer that simply toggles the two outputs from the post-accumulator digital processing section 306 at full-speed, i.e., at a rate of $f_{CLK}$, to produce the final DDS output OUT. In a different embodiment of the invention, the digital-to-analog conversion and serialization are subsumed into a single interleaved radio frequency DAC (RF-DAC). In either approach, once the samples have been serialized into the full-speed serialized output OUT, they can then be passed through a low-pass filter to remove aliasing images and quantization noise.

One significant advantage the DDS 300 has over the prior art DDS 100 is that the DDS 300 can produce an output OUT having the same output frequency $f_{OUT}$ and same frequency tuning resolution as the prior art DDS 100 but while clocking the accumulator 304 at only half the reference clock frequency, i.e., $f_{CLK}/2$. The post-accumulator digital processing section 306 also operates at half-speed. In fact, the only component of the DDS 300 that operates at full speed ($f_{CLK}$) is the serializer 308 (or the interleaved DAC, if it is used, instead). Viewed another way, for the same accumulator width n and same tuning word M, when the accumulator 304 is configured to accumulate at the same rate as the accumulator 102 in the prior art DDS 100, i.e., at a reference clock frequency $f_{REF}=f_{CLK}/B=f_{CLK}/2$, the DDS 300 synthesizes an output waveform having a frequency $f_{OUT}$ that is two times (i.e., double) the output frequency of the prior art DDS 100. Accordingly, when viewed from this perspective, the DDS 300 may be aptly referred to as a "frequency-doubling" or "frequency-multiplying" DDS 300.

Figure 6:
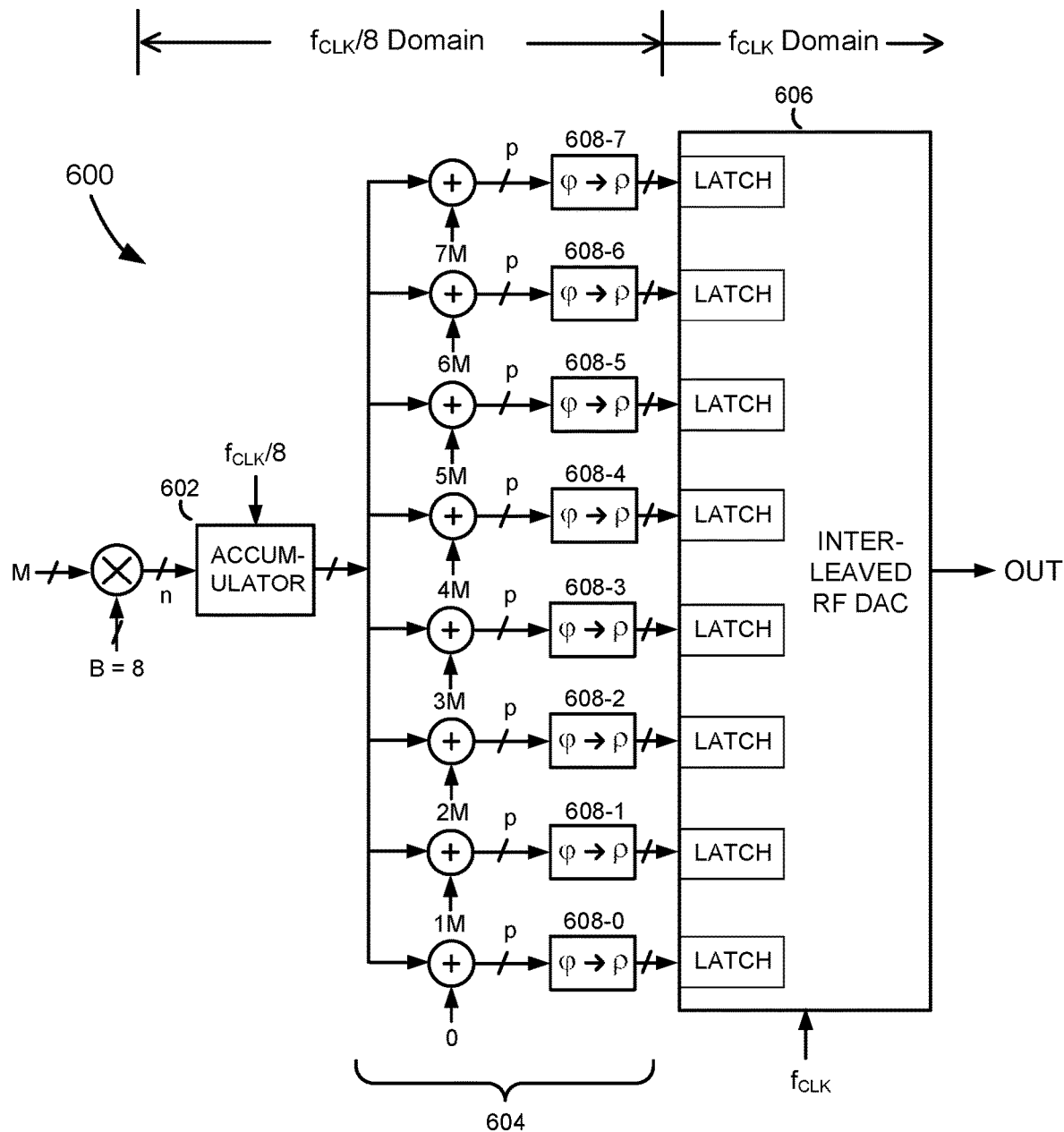
FIG. 6 is a drawing depicting a frequency-multiplying DDS, according to another embodiment of the present invention.

The frequency-multiplying attribute of the present invention is not limited to a DDS having a multiplier of B=2. FIG. 6 shows, for example, how frequency multiplying can be extended to a multiplier of B=8. According to this exemplary DDS 600, the accumulator 602 and post-accumulator digital processing section 604 operate slowly, at a clock rate of $f_{CLK}/8$. Only the interleaved RF-DAC 606 needs to operate at full speed ($f_{CLK}$). For the same reference clock frequency, the frequency-multiplying property of the DDS 600 thus affords the ability to produce an output frequency $f_{OUT}$ eight times that produced by the prior art DDS 100.

Figure 7:
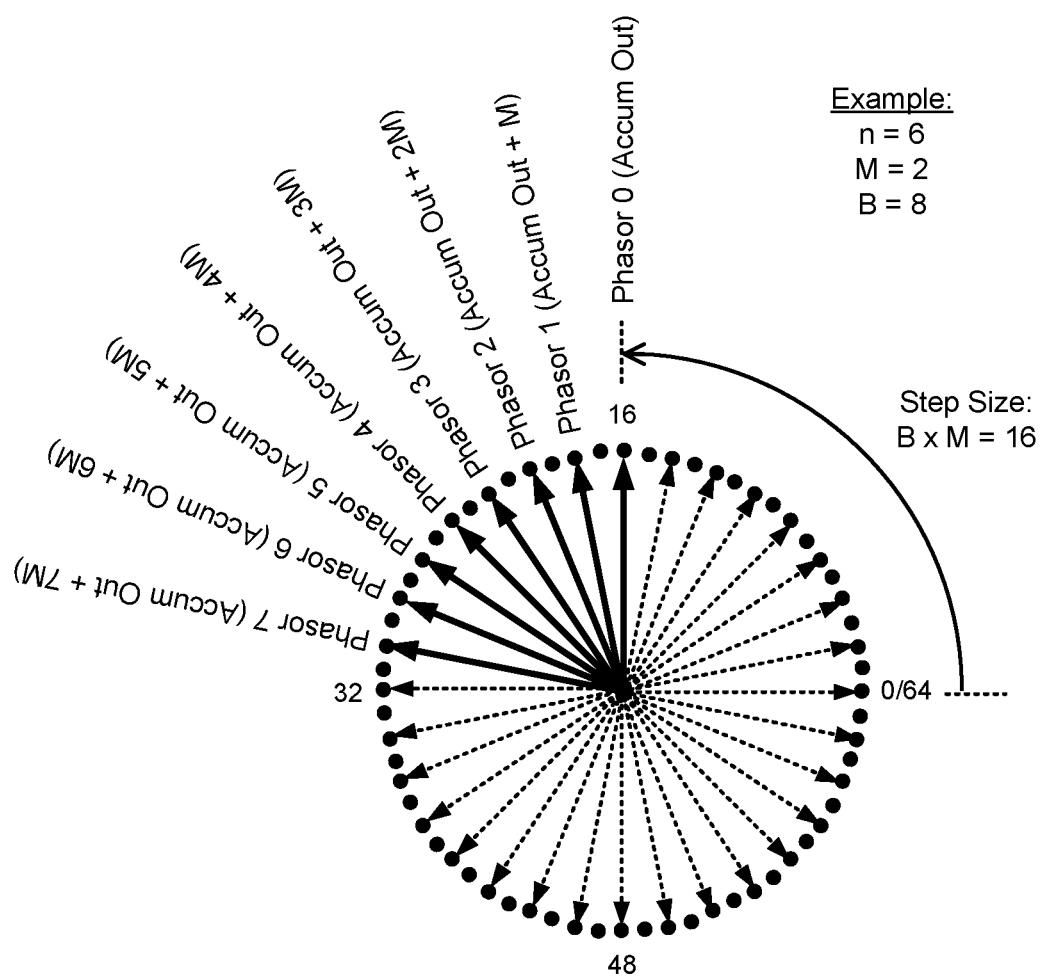
FIG. 7 is a drawing of a phase wheel, illustrating the operation of the accumulator and the post-accumulator digital processing section of the frequency-multiplying DDS depicted in FIG. 6.
Figure 8:
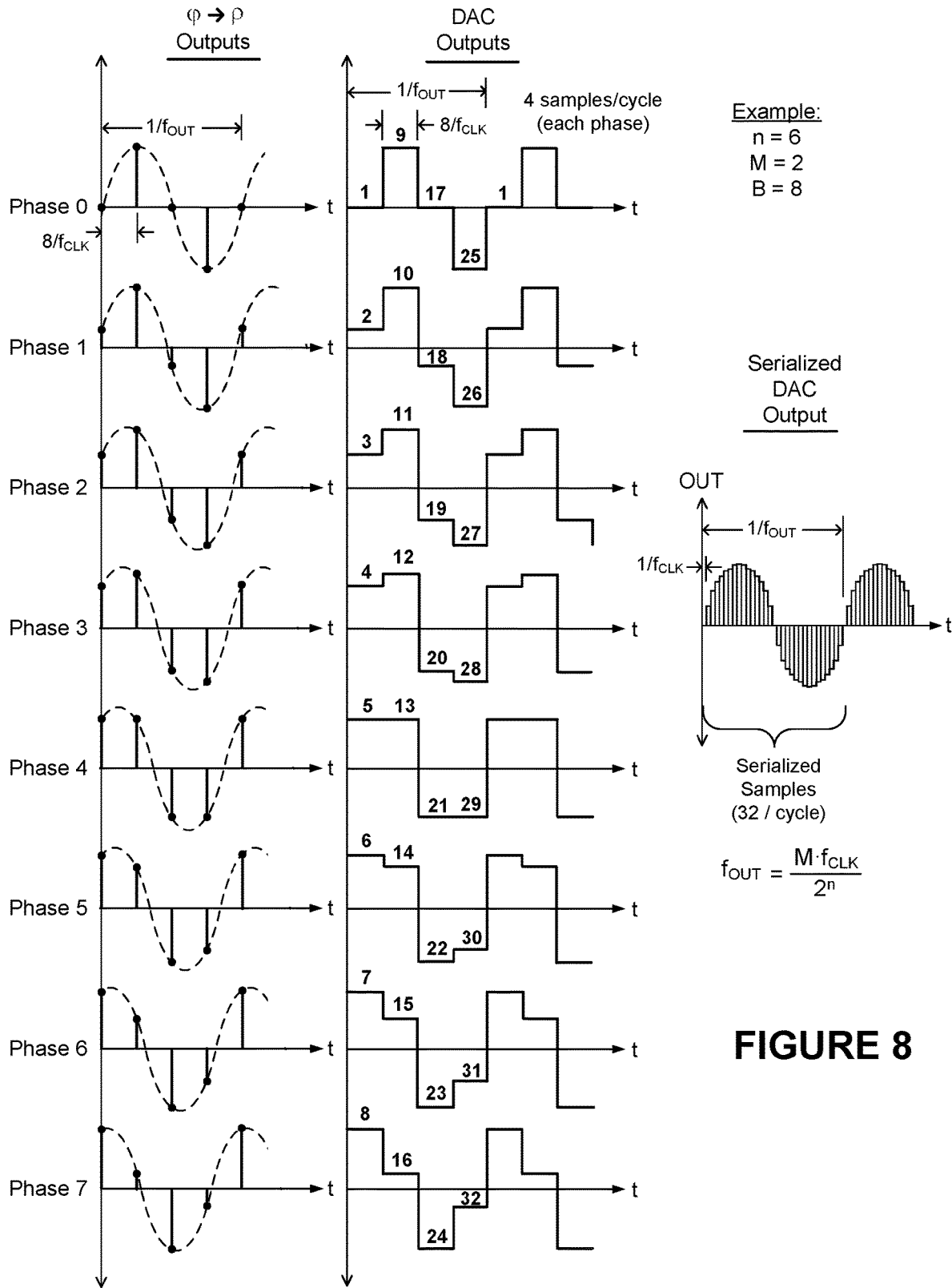
FIG. 8 includes timing diagrams of the outputs of the φ-to-ρ converters of the post-accumulator digital processing section of the frequency-multiplying DDS depicted in FIG. 6, a timing diagram of the final DDS's output analog waveform, and intermediate 'DAC output' timing diagrams illustrating how, effectively, the low-speed samples produced by the post-accumulator digital processing section are serialized by the DDS's interleaved radio frequency DAC (RF-DAC)

FIG. 7 is a drawing of a phase wheel for the DDS 600, where, for purpose of example it is assumed that n=6, M=2 and B=8. Phasor 0 in the phase wheel represents the instantaneous phase of a first sinusoid being synthesized in the first branch of the eight-branch post-accumulator digital processing section 604; phasor 1 represents the instantaneous phase of a second sinusoid being synthesized in the second branch, and so on. The phase wheel further shows that phasor 7 leads phasor 6 by $(M/2^n) \times 2\pi$ radians, phasor 6 leads phasor 5 by the same by $(M/2^n) \times 2\pi$ radians, etc. Since in this example B=8 and M=2, all eight phasors rotate around the phase wheel in steps of $(M \times B)/2^n \times 2\pi$ radians, one step per each tick of the slow-speed clock ($f_{CLK}/8$). FIG. 8 shows timing diagrams of the digital sinusoids produced at the outputs of the φ-to-ρ converters 608-0, 608-1, . . . 608-7 (left-most column of timing diagrams); the quantized analog waveforms produced by the digital-to-analog conversion process (middle column of timing diagrams); and the full-speed serialized output OUT produced by the interleaved RF-DAC 606 (right-most diagram). The timing diagrams illustrate: 1) how each of the eight digital sinusoids (i.e., "phases") synthesized in the eight branches of the post-accumulator digital processing section 604 (i.e., each of the eight DDS "phases") is offset from an adjacent phase by $\Delta t = (M/2^n) \times 1/f_{OUT} = (1/32) \times 1/f_{OUT}$ seconds; 2) how each digital phase has $2n/(M \times B) = 64/16 = 4$ samples per cycle $1/f_{OUT}$; 3) how the serialized DAC output OUT has $B \times 2^n/(M \times B) = 32$ samples per cycle $1/f_{OUT}$; and 4) how the final serialized DAC output OUT has an output frequency $f_{OUT} = (M/2^n) \times f_{CLK}$. The first thirty-two samples of the first period of the output OUT are labeled "1" to "32" in the "DAC outputs" timing diagram (middle column of timing diagrams), to illustrate how (effectively) the low-speed samples produced by the post-accumulator digital processing section 604 are "scanned" and serialized by the interleaved RF-DAC 606. As with the DDS 300 described above, if necessary or desired, the final output analog waveform OUT produced by the DDS 600 can be passed through a low-pass filter to remove aliasing images and quantization noise.

From the foregoing description it should be clear that the output frequency $f_{OUT}$ of the DDSs 300 and 600 can be increased not only by increasing the value of the multiplier B but also by increasing the value of $f_{CLK}$. There is, however, a fundamental limit on how fast the accumulators 304 and 602 can accumulate and, consequently, how fast their reference clocks can be. This limit can be more readily understood by referring to FIG. 9, which depicts in more detail one way the accumulators 304 and 602 can be constructed. The accumulator 900 comprises n registers (in this case, n delay or "D" flip-flops ((DFFs)) and n full adders, and the carry-out of each lower-significant-bit full adder is connected to the carry-in of its adjacent and next-significant-bit full adder. The bottleneck that constrains the maximum possible reference clock frequency $f_{CLK}/B$ relates to the carry logic of the full adders. Specifically, the DFFs cannot be triggered until the carry bits from the full adders have propagated through the entire n-bit carry propagation path. This propagation delay can be significant if n is large.

Figure 9:
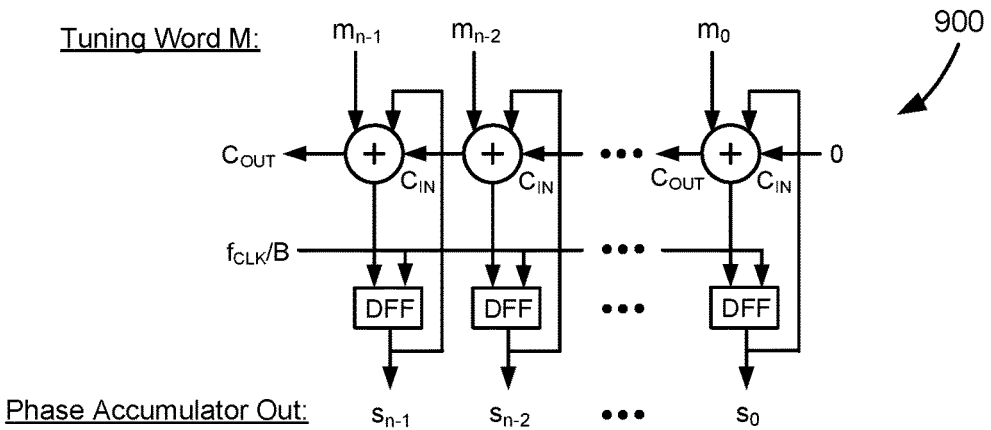
FIG. 9 is a drawing illustrating one way that the accumulators in the DDSs depicted in FIGS. 3 and 6 can be implemented.
Figure 10:
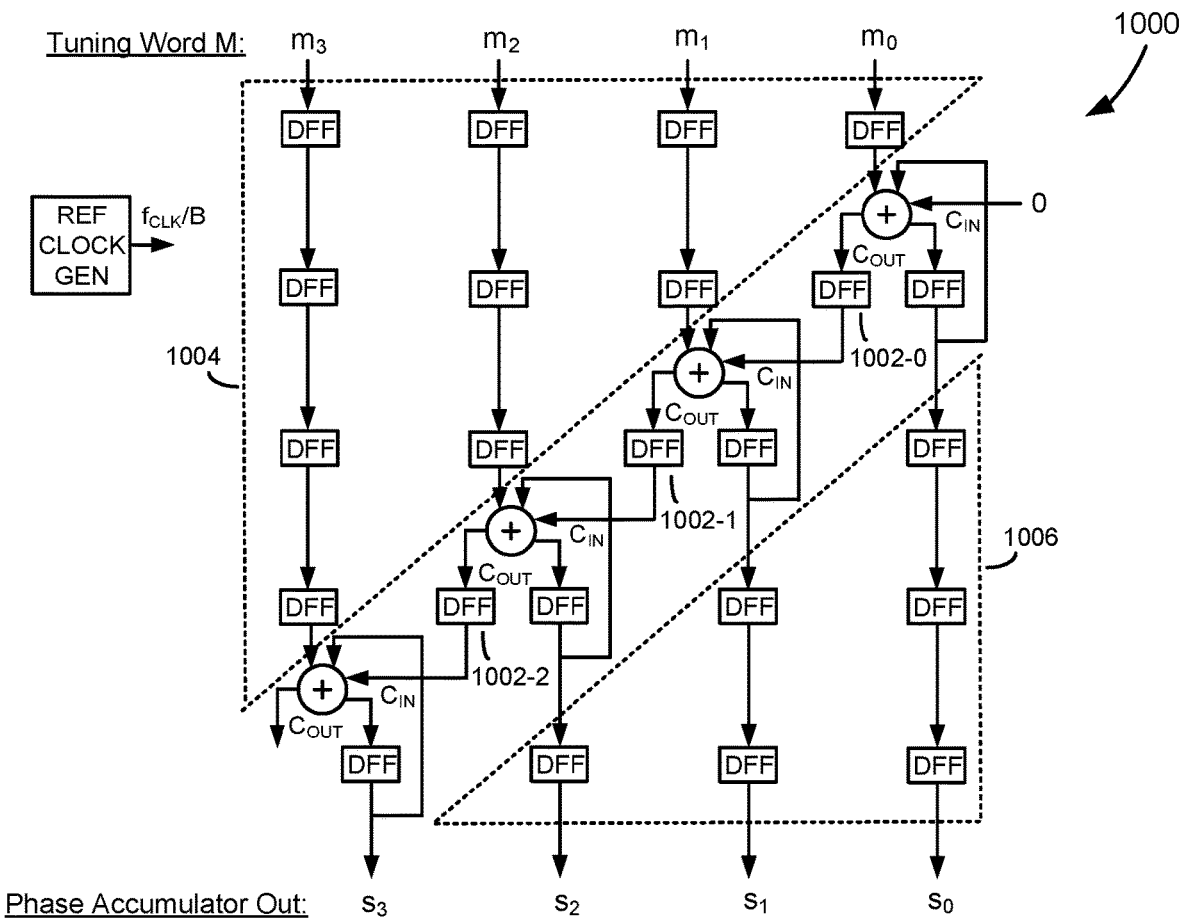
FIG. 10 is a drawing illustrating another way that the accumulators in the DDSs depicted in FIGS. 3 and 6 can be implemented.

To mitigate this problem, in one embodiment of the invention, instead of employing an accumulator 900 like that depicted in FIG. 9, a 'pipelined' accumulator 1000 similar to that depicted in FIG. 10 is used. (For ease in illustration, only a 4-bit example is provided in the drawing. In an actual implementation, the width n would normally be much wider than 4.) Partitioning the n-bit carry propagation path with registers (DFFs) 1002-0, 1002-1, 1002-2 retimes the system to effectively reduce the n-bit carry propagation delay to that of just a single one-bit adder. This provides the accumulator 1000 the time it needs to update its output on every cycle of the reference clock. (Note that, in addition to the partitioning registers 1002-0, 1002-1, 1002-3, the pipelined accumulator 1000 further includes ancillary pre-skewing and de-skewing registers 1004 and 1006. These additional registers are included so that coherency is maintained between the accumulator input ($m_3$, $m_2$, $m_1$, $m_0$) and accumulator output ($s_3$, $s_2$, $s_1$, $s_0$).

By using a pipelined accumulator, the maximum possible reference clock frequency $f_{CLK}(max)$ and, consequently, the maximum output frequency $f_{OUT}(max)$ can be increased above that which is possible using a non-pipelined accumulator, albeit at the expense of increased latency. A similar pipelining approach can be used for the n-bit adders in the post-accumulator digital processing sections 306 and 604 of the DDSs 300 and 600. For example, with respect to the DDS 300 described above in reference to FIG. 3, the n-bit zero-offset and step-offset adders 314 and 320 could be partitioned in a manner similar to how the pipelined accumulator 1000 in FIG. 10 is partitioned.

While various embodiments of the present invention have been described, they have been presented by way of example and not limitation. Persons skilled in the relevant art will appreciate and understand that various changes in form and detail may be made to the exemplary embodiments of the invention, as presented, without departing from the true spirit and scope of the invention. Accordingly, the scope of the invention should not be limited by the specifics of the exemplary embodiments but, instead, should be determined by the appended claims, including the full scope of equivalents to which such claims are entitled.

The invention claimed is:

1. A direct digital synthesizer (DDS), comprising:
a digital multiplier configured to multiply a digital tuning word by a digital multiplier and produce a digital product;
an accumulator configured to accumulate at a step size of the digital product and at a rate of a reference clock; and
a post-accumulator digital processing section including two or more branches configured to synthesize two or more digital waveforms from a sequence of output numbers produced by the accumulator.

2. The DDS of claim 1, further comprising:
a serializer configured to serialize digital samples of the two or more digital waveforms and produce an output digital waveform; and
a digital-to-analog converter (DAC) configured to convert the output digital waveform to a final output analog waveform.

3. The DDS of claim 2, wherein the serializer and DAC together comprise a single interleaved radio frequency DAC (RF-DAC).

4. The DDS of claim 1, further comprising:
two or more digital-to-analog converters (DACs) configured to convert the two or more digital waveforms to two or more analog waveforms; and
a serializer that samples the two or more analog waveforms to produce a final output analog waveform.

5. The DDS of claim 1, wherein the two or more branches of the post-accumulator digital processing section comprise:
a zero-offset digital adder in a first branch configured to add, on each cycle of the reference clock, each output number from the sequence of accumulator output numbers to a digital word of value zero; and
one or more step-offset digital adders, each of the one or more step-offset digital adders configured to add, on each cycle of the reference clock, each output number from the sequence of accumulator output numbers to a digital word that is a multiple of the tuning word.

6. The DDS of claim 5, wherein:
the two or more branches of the post-accumulator digital processing section comprises B branches that synthesize B digital waveforms, where B is a decimal integer equivalent of the digital multiplier and greater than or equal to two;
the one or more step-offset digital adders includes (B−1) branches;
a first digital sum produced by a first step-offset adder in a first one of the (B−1) branches is a first digital number representing a first phase; and
a second digital sum produced by a second step-offset adder in a second one of the (B−1) branches adjacent the first one of the (B−1) branches is a second digital number representing a second phase offset from the first phase by $(M/2^n) \times 2\pi$ radians, where M is a number representing the digital tuning word and n is a number representing a word width of the accumulator.

7. The DDS of claim 6, wherein the B branches of the post-accumulator digital processing section comprises B phase-to-amplitude ($\varphi$-to-$\rho$) converters configured to convert B digital sums produced by the zero-offset and step-offset digital adders to the B digital waveforms.

8. The DDS of claim 1, wherein the accumulator comprises an n-bit pipelined accumulator, where n is a decimal number representing a word width of the n-bit accumulator.

9. A method of synthesizing a periodic waveform, comprising:
multiplying a digital tuning word by a digital multiplier to produce a digital product;
accumulating at a step size of the digital product and at a rate of a low-speed reference clock to produce a sequence of accumulator output numbers;
generating a first digital waveform from the sequence of accumulator output numbers, at a rate of the low-speed reference clock;
adding the digital tuning word or a multiple of the digital tuning word to each number in the sequence of accumulator output numbers to produce a modified sequence of accumulator output numbers; and
while the first digital waveform is being generated, generating a second digital waveform from the modified sequence of accumulator output numbers, at a rate of the low-speed reference clock.

10. The method of claim 9, further comprising:
serializing samples of the first and second digital waveforms at a rate of a high-speed reference clock to produce a high-speed serialized digital waveform; and
converting the high-speed serialized digital waveform to a final output analog waveform.

11. The method of claim 10, wherein the high-speed serialized digital waveform has $2^n/M$ samples per cycle, and the final output analog waveform has a frequency $f_{OUT}=(M/2^n) \times f_{CLK}$, where M is a value of the digital tuning word and n is a word width of the accumulator.

12. The method of claim 9, further comprising:
converting the first digital waveform to a first analog waveform;
converting the second digital waveform to a second analog waveform; and
sampling and serializing the first and second analog waveforms, to produce a final output analog waveform.

13. The method of claim 12, wherein the first and second analog waveforms are sampled and serialized at a rate of a high-speed reference clock, and the final output analog waveform has a frequency $f_{OUT}=(M/2^n) \times f_{CLK}$, where $f_{CLK}$ represents the frequency of the high-speed reference clock, M is a value of the digital tuning word and n is a word width of an accumulator that performs the accumulating.

14. The method of claim 9, wherein the accumulating is performed by an n-bit pipelined accumulator, where n is a decimal number representing a word width of the n-bit pipelined accumulator.

* * * * *